United States Patent
Jung et al.

(10) Patent No.: US 10,725,112 B1
(45) Date of Patent: Jul. 28, 2020

(54) METHODS OF CONTROLLING SECONDARY LITHIUM METAL BATTERIES TO ACCESS RESERVE ENERGY CAPACITY AND BATTERY CONTROL SYSTEMS INCORPORATING THE SAME

(71) Applicant: SES Holdings Pte. Ltd., Singapore (SG)

(72) Inventors: SangOh Jung, Winchester, MA (US); Yury Matulevich, Burlington, MA (US); Mackenzie King, Essex, MA (US); Qichao Hu, Arlington, MA (US)

(73) Assignee: SES Holdings Pte. Ltd., Singapore (SG)

( * ) Notice: Subject to any disclaimer, the term of this patent is extended or adjusted under 35 U.S.C. 154(b) by 0 days.

(21) Appl. No.: 16/530,751

(22) Filed: Aug. 2, 2019

Related U.S. Application Data

(60) Provisional application No. 62/812,360, filed on Mar. 1, 2019, provisional application No. 62/832,667, filed on Apr. 11, 2019.

(51) Int. Cl.
| | |
|---|---|
| *G01R 31/3835* | (2019.01) |
| *H01M 10/0525* | (2010.01) |
| *G01R 31/388* | (2019.01) |
| *H01M 10/44* | (2006.01) |
| *H02J 7/00* | (2006.01) |
| *H01M 10/42* | (2006.01) |

(52) U.S. Cl.
CPC ....... *G01R 31/3835* (2019.01); *G01R 31/388* (2019.01); *H01M 10/0525* (2013.01); *H01M 10/44* (2013.01); *H02J 7/00716* (2020.01); *H01M 2010/4271* (2013.01)

(58) Field of Classification Search
CPC ... H02J 7/044; G01R 31/3835; G01R 31/388; H01M 10/0525; H01M 10/44; H01M 2010/4271
USPC ....................................................... 320/132
See application file for complete search history.

(56) References Cited

U.S. PATENT DOCUMENTS

| | | | |
|---|---|---|---|
| 8,150,642 B2 * | 4/2012 | Kimura | G01R 31/392 702/63 |
| 10,177,398 B2 | 1/2019 | Li et al. | |
| 2013/0057293 A1 * | 3/2013 | Miyamoto | G01R 31/025 324/433 |

(Continued)

FOREIGN PATENT DOCUMENTS

WO    2017214276 A1    12/2017

OTHER PUBLICATIONS

Heike Gabrisch, Rachid Yazami, and Brent Fultz, "Hexagonal to cubic spinel transformation in lithiated cobalt oxide," Journal of the Electrochemical Society, 151 (6) A891-A897 (1084).

*Primary Examiner* — Nathaniel R Pelton
(74) *Attorney, Agent, or Firm* — Downs Rachlin Martin PLLC

(57) ABSTRACT

Aspects of the present disclosure include control systems for controlling secondary lithium metal batteries and for controlling electric devices powered, at least in part, thereby, that enable access to reserve energy stored in the lithium metal battery that is not typically available during normal operation. In some examples, the control systems provide access to the reserve energy in response to an emergency, such as requiring excess energy to power an electric device to a safe location.

28 Claims, 6 Drawing Sheets

(56) References Cited

U.S. PATENT DOCUMENTS

| | | | | |
|---|---|---|---|---|
| 2015/0243974 A1* | 8/2015 | Holme | ................. | H01M 4/366 |
| | | | | 318/139 |
| 2018/0034267 A1* | 2/2018 | Vasefi | ................. | H01M 2/1016 |
| 2018/0358661 A1 | 12/2018 | Yebka et al. | | |
| 2019/0245353 A1* | 8/2019 | Varma | ....................... | H02J 3/01 |
| 2019/0296333 A1* | 9/2019 | Liu | ..................... | H01M 4/5825 |

* cited by examiner

METHODS OF CONTROLLING SECONDARY LITHIUM METAL BATTERIES TO ACCESS RESERVE ENERGY CAPACITY AND BATTERY CONTROL SYSTEMS INCORPORATING THE SAME

RELATED APPLICATION DATA

This application claims the benefit of priority of U.S. Provisional Patent Application Ser. No. 62/812,360, filed Mar. 1, 2019, and titled, "A Parachute Energy For Lithium Metal Battery," and U.S. Provisional Patent Application Ser. No. 62/832,667, filed Apr. 11, 2019, and titled "Parachute Energy For Lithium Metal Battery," which are both incorporated by reference herein in their entireties.

FIELD OF THE INVENTION

The present invention generally relates to the field of battery control systems for secondary lithium metal batteries. In particular, the present invention is directed to methods of controlling secondary lithium metal batteries to access reserve energy capacity and battery control systems incorporating the same.

BACKGROUND

Secondary (also referred to as rechargeable) lithium metal batteries provide great promise for the next generation of energy storage devices due to the significantly higher energy density they provide. Unlike conventional lithium ion batteries, which contain anodes (also referred to as negative electrodes) formed from an intercalant material, such as graphite, lithium metal battery anodes are formed from lithium metal, for example, thin sheets of lithium metal coupled to current collectors. The intercalation anodes of lithium ion batteries only provide host structures for lithium ions and do not contribute to energy storage. Lithium metal battery anodes, by contrast, are formed, in part, by lithium metal, which contributes to energy storage, thereby significantly increasing volumetric and gravimetric energy density.

SUMMARY OF THE DISCLOSURE

In one implementation, the present disclosure is directed to a method of controlling a lithium metal battery having a lithium metal anode and a cathode with intercalation sites, the lithium metal battery having a normal operating range between 100% state of charge (SOC) and 0% SOC, the 0% SOC corresponding to a discharge condition where substantially all of the cathode intercalation sites are saturated with lithium ions. The method includes monitoring an operating condition of the lithium metal battery as the battery discharges energy; receiving a reserve energy signal; and allowing the battery to enter a reserve energy operating range and discharge reserve energy by allowing the battery to discharge energy below a SOC of 0% in response to the reserve energy signal.

In another implementation, the present disclosure is directed to a method of operating a load. The method includes receiving a battery signal, the battery signal including operating condition information for a lithium metal battery providing electrical energy to the load; determining, based on the battery signal, whether a reserve energy capacity of the battery is required; and sending a reserve energy signal to the battery in response to determining the reserve energy capacity is required; wherein the reserve energy signal includes an instruction to allow a voltage of the battery to drop below a normal operating range cutoff voltage.

In still another implementation, the present disclosure is directed to a battery controller for controlling a lithium metal battery having a lithium metal anode and a cathode with intercalation sites, the lithium metal battery having a normal operating range between 100% state of charge (SOC) and 0% SOC, the 0% SOC corresponding to a discharge condition where substantially all of the cathode intercalation sites are saturated with lithium ions. The battery controller includes a processor configured to be operably coupled to the lithium metal battery and configured to monitor an operating condition of the lithium metal battery as the battery discharges energy; receive a reserve energy signal; and allow the battery to enter a reserve energy operating range and discharge reserve energy by allowing the battery to discharge energy below a SOC of 0% in response to the reserve energy signal.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Aspects of the present disclosure include control systems for controlling secondary lithium metal batteries and for controlling electric devices powered, at least in part, thereby, that enable access to excess or reserve energy stored in the lithium metal battery that is not typically available during normal operation. In some examples, the control systems provide access to the reserve energy in response to an emergency, such as requiring excess energy to power an electric device for transportation to a safe location. In some examples, access to the excess energy damages the battery, for example, reducing battery lifetime. In some examples, aspects of the present disclosure include secondary lithium metal batteries with anodes designed and configured to provide reserve energy.

Figure 1:
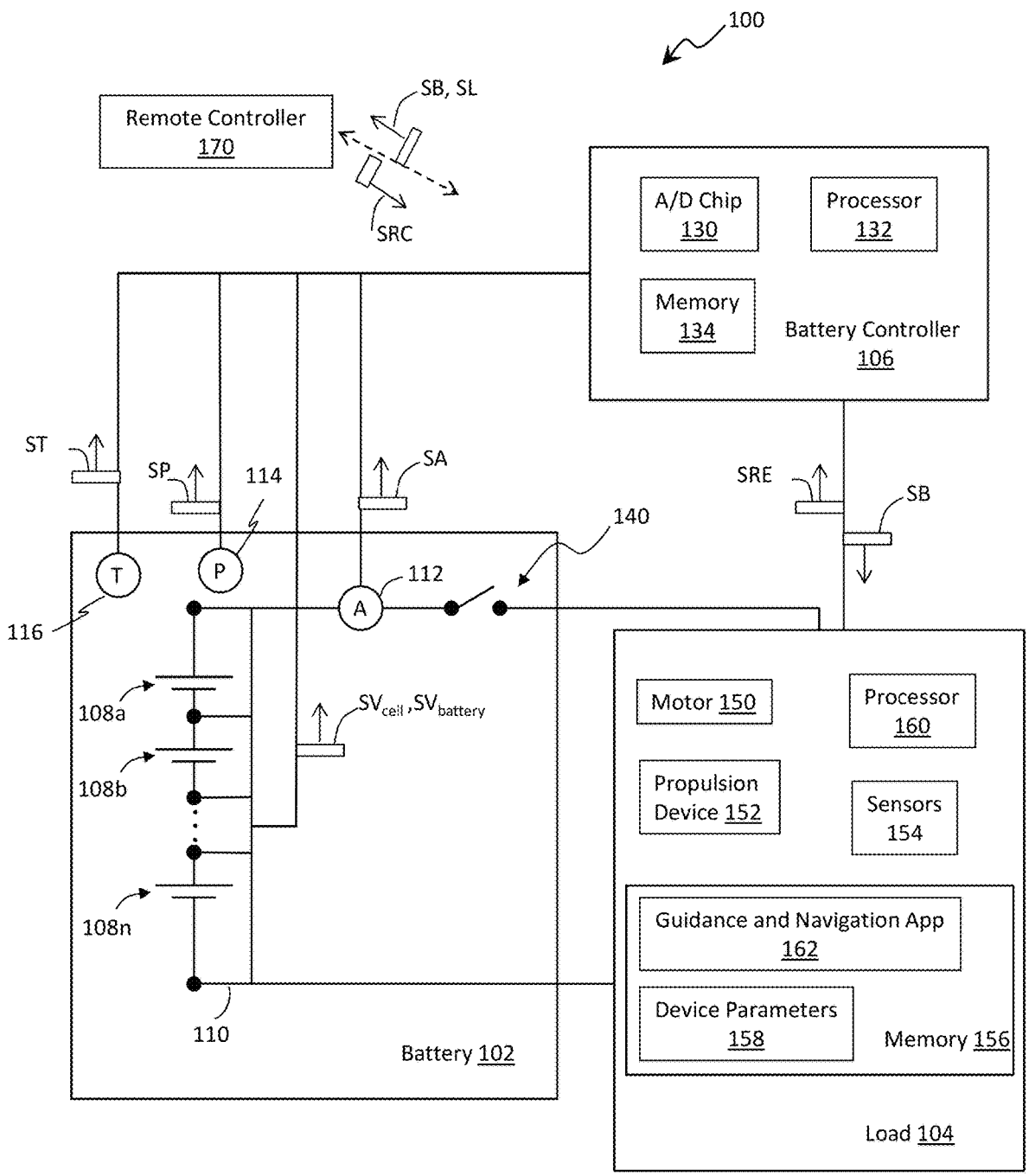
FIG. 1 is a schematic diagram of an example lithium metal battery, load, and control systems according to the present disclosure.

FIG. 1 is a schematic illustration of an example system 100 made in accordance with the present disclosure that includes a lithium metal battery 102 operably connected to a load 104 for providing electrical energy to the load and a battery controller 106 for controlling the battery. As described more below, battery controller 106 may be configured to access a reserve energy capacity of battery 102 that is normally not used or available during normal operation of the battery, but that can be selectively accessed when needed.

In the illustrated example, battery 102 includes a plurality of electrochemical cells 108a, 108b, . . . 108n that may be connected in series or parallel for generating electrical energy for load 104. A voltage can be imposed across the positive and negative electrodes of cells 108 by creating a circuit 110, or electrical connection, between the electrodes. Battery controller 106 may also be operably and/or communicatively coupled to the cell electrodes and configured to receive individual cell voltage signals $SV_{cell}$ and a battery voltage signal $SV_{battery}$ for monitoring the voltage across each cell 108 and the total voltage generated by the battery 102. Battery 102 also includes a current sensor 112 configured to generate a current signal, SA, a pressure sensor 114 configured to generate a pressure signal SP, and a temperature sensor 116 configured to generate a temperature signal ST. Battery controller 106 is communicatively coupled to each of current, pressure, and temperature sensors 112, 114, and 116 for receiving the generated signals SA, SP, and ST for monitoring a state of battery 102 in realtime. Pressure sensor 114 may include one or more sensors located throughout battery 102 for directly or indirectly monitoring the pressure generated within battery 102 during use, for example, pressure generated by lithium plating on the anode and/or cathode of the cells 108 and/or the pressure generated by any gases generated in the cells during charge or discharge. In one example, pressure sensor 114 includes one or more strain gauges located, for example, between adjacent cells 108 and/or between a cell and an adjacent packing or housing for monitoring a force generated by the cell due to an expansion of the cell due to lithium plating or generated gases. Temperature sensor 116 may include one or more of any type of temperature sensors known in the art, such as one or more thermocouples or thermistors.

Battery controller 106 may include an A/D chip 130 for converting analog signals, such as one or more of current, pressure, and temperature signals SA, SP, and/or ST to a digital signal, one or more processors and/or microcontrollers 132, and a memory 134. Battery 102 or battery controller 106 may also include a variety of other features and components known in the art, but not illustrated, such as a voltage converter and regulator circuit to maintain safe levels of voltage and current; an electrical connector that lets power and information flow in and out of the battery, etc. Processor 132 may be configured with instructions for providing a battery state of charge, for estimating a present state of charge of the battery and to store data in memory 134 related to battery parameters and also transmit battery parameters to other processors.

Processor 132 may be configured with instructions for monitoring overcharge (overvoltage), overdischarge (undervoltage) and excessive charge and discharge currents (overcurrent, short circuit). Processor 132 can also be configured with instructions to protect battery 102 from harmful over or under charging or overcurrent conditions, for example, by controlling a switch 140 (e.g., a MOSFET or other control device) to limit energy transfer or fully disconnect battery 102 from load 104 or a charger.

In some examples, processor 132 may be configured to monitor voltage signals $V_{cell}$, $V_{battery}$ during charging and discharging to determine if any individual cell 108 is in a potentially damaging state. For example, during charging, an individual cell 108 may reach or exceed a safe voltage level even though the overall battery voltage $V_{battery}$ is still below a safe level. Similarly, during discharge, the voltage of an individual cell 108 may drop below a minimum safety threshold, $V_{cut-off}$, even though the voltage of the overall battery voltage is still above its minimum safety threshold. In such events, processor 132 can discontinue charging or discharging battery 102 or an individual cell 108 when the processor detects an individual cell voltage at an undesired value. Processor 132 can also evaluate the relative voltage levels of adjacent cells 108 and redistribute charge between the adjacent cells to mitigate differences in the cell voltages.

Battery controller 106 may also be communicatively coupled to load 104 during discharge and/or a charger (not illustrated) during charging. Battery controller 106 may provide a battery signal, SB to load 104, which may include any of a variety of historical and realtime battery parameter information, such as realtime values of battery voltage, current, temperature, pressure, SOC, and depth of discharge (DOD). Load 104 may be configured to provide a reserve energy signal, SRE, to battery controller 106 to instruct the battery controller to allow the battery 102 to continue to discharge into a reserve energy portion of the stored energy of cells 108. As described more below, battery controller 106 may reduce or deactivate a minimum battery voltage, $V_{cut-off}$, to allow continued discharge of battery 102 below $V_{cut-off}$, which may result in cells 108 transitioning from a normal operation chemical process, where lithium ions from the cell anodes are received at intercalation sites of adjacent cathodes, to a reserve energy chemical process, where an electric potential continues to be generated by the cells after cathode intercalation sites are substantially full.

Load 104 may be any device that consumes electrical energy. Non-limiting examples are computing devices (cell phone, tablet, laptop, etc.), and land, air, or water-based electric vehicles (e.g., bicycle, automobile, motorcycle, manned or unmanned aerial vehicle, boat, submarine etc.). Load 104 may include an electric drive system that includes one or more electric motors 150 for powering one or more propulsion devices for providing motive force or directional control of the load, such as wheels, or water or air propellers, ailerons, rudders, elevators, stabilizers, etc. Load 104 may also include one or more sensors 154 for monitoring realtime conditions of the load, such as compasses, GPS receivers, inertial measurement units, altimeters, internal and ambient temperature sensors, anemometers, pitot tubes, speedometers, and motor condition sensors (e.g., motor voltage, current, temperature, etc.). Load 104 may also include a memory 156 configured to store data, such as device parameters 158, which may include any specifications of load 104 or battery 102, such as the weight and aerodynamic or fluid dynamic characteristics of the load. Memory 156 may also include one or more applications executable by processor 160, such as a guidance and navigation application 162 for providing realtime position and trajectory information and for controlling the speed and position of the load.

System 100 may also include a remote controller 170 for providing remote control signals, SRC to battery 102 and load 104 and for receiving battery signals, SB, and load signals, SL, from the battery and load, via any wired or wireless communication known in the art. For example, each of remote controller 170, battery controller 106, and load 104 may include one or more communication modules (not illustrated) configured for one or more wireless communication protocols.

Figure 2:
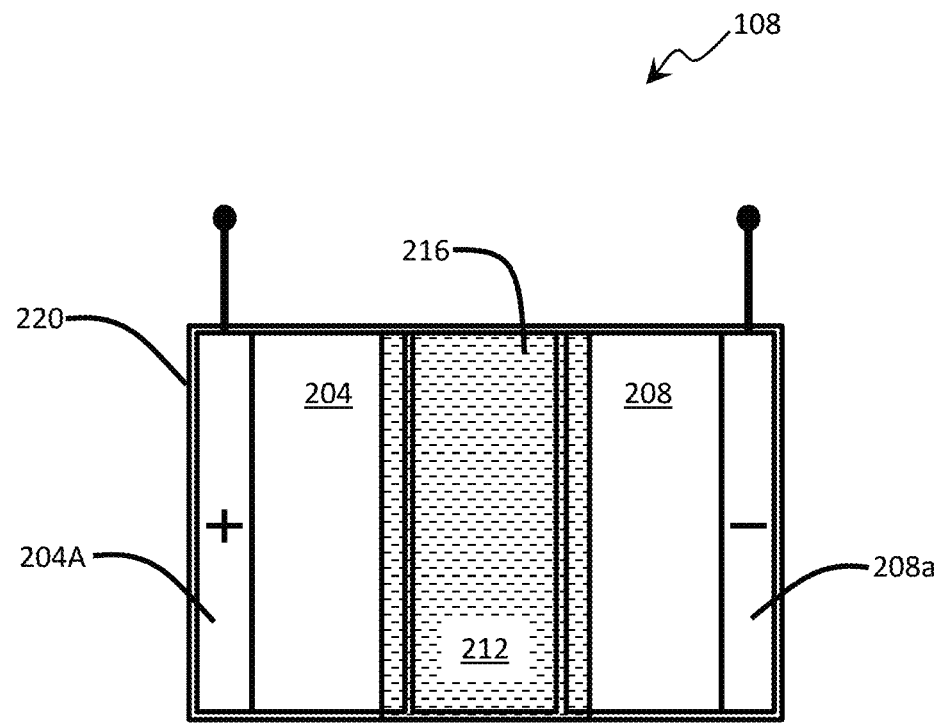
FIG. 2 is a schematic diagram of an example rechargeable lithium metal cell of the battery of FIG. 1.

FIG. 2 illustrates an example cell 108 of battery 102. FIG. 2 illustrates only some basic functional components of a cell 108. A real-world instantiation of the cell and/or battery 102 will typically be embodied using either a wound or stacked construction include other components, such as electrical terminals, seal(s), thermal shutdown layer(s), and/or vent(s), among other things, that, for ease of illustration, are not shown in FIG. 2.

In the illustrated example, cell 108 includes spaced-apart cathode 204 and anode 208, and a pair of corresponding respective current collectors 204A, 208A. A porous dielectric separator 212 is located between the cathode 204 and anode 208 to electrically separate the cathode and anode but to allow lithium ions and ions of an electrolyte 216 to flow therethrough. The porous dielectric separator 212 and/or one, the other, or both of cathode 204 and anode 208 may also be impregnated with the electrolyte 216. The cell 108 includes a container 220 that contains the current collectors 204A, 208A, cathode 204, anode 208, porous dielectric separator 212, and electrolyte 216.

The cathode 204 and anode 208 may comprise a variety of different structures and materials compatible with lithium-metal ions and electrolyte 216. Each of the current collectors 204A, 208A may be made of any suitable electrically conducting material, such as copper or aluminum, or any combination thereof. The porous dielectric separator 212 may be made of any suitable porous dielectric material, such as a porous polymer, among others.

Cathode 204 may be formed from a variety of materials such as a material of the general formula of LixMyOz, where M is a transition metal such as Co, Mn, Ni, V, Fe, or Cr, and x, y, z are chosen to satisfy valence requirements. In one or more embodiments, the cathode is a layered or spinel oxide material selected from the group comprising of LiCoCh, Li(Nii/3Mni/3Coi/3)O2, Li(Nio.8Coo.i5Alo.o5)02, LiMn2O4, Li(Mn$_{1.5}$ Ni$_{0.5}$)$_2$O$_4$, or their lithium rich versions. In one or more embodiments, the cathode material is LiCoCh (charged to 4.4V vs. Li metal), NCA or NCM (622, 811) (charged to 4.30V vs. Li metal).

As described more below, in some examples, cathode 204 is constructed from materials with a layered structure (e.g. LCO, NCM662, NCM811) that can be changed to other structure types relatively easily after all intercalation sites of the cathode material have been filled with lithium ions. For example, a layered structure of high temperature LCO as opposed to a cubic spinel-type structure of low temperature LCO. Example cathode materials with layered structure are described in Heike Gabrisch, Rachid Yazami, and Brent Fultz, "Hexagonal to cubic spinel transformation in lithiated cobalt oxide," Journal of The Electrochemical Society, 151 (6) A891-A897 (1084) (available at https://authors.library.caltech.edu/3039/1/GABjes04.pdf). Anode 208 may be a thin lithium metal anode that, in the discharged state has a thickness in the range of 10 μm-100 μm, or 20 μm-80 μm, or 40 μm-60 μm. Although FIG. 2 schematically shows anode 208 adjacent current collector 208a, the anode material, e.g., sheets or films of lithium metal may be disposed on both sides of the current collector. Further information regarding example materials and constructions of cells 108 can be found in PCT publication number WO 2017/214276, titled, "High energy density, high power density, high capacity, and room temperature capable 'anode-free' rechargeable batteries," which is incorporated by reference herein in its entirety.

Figure 3:
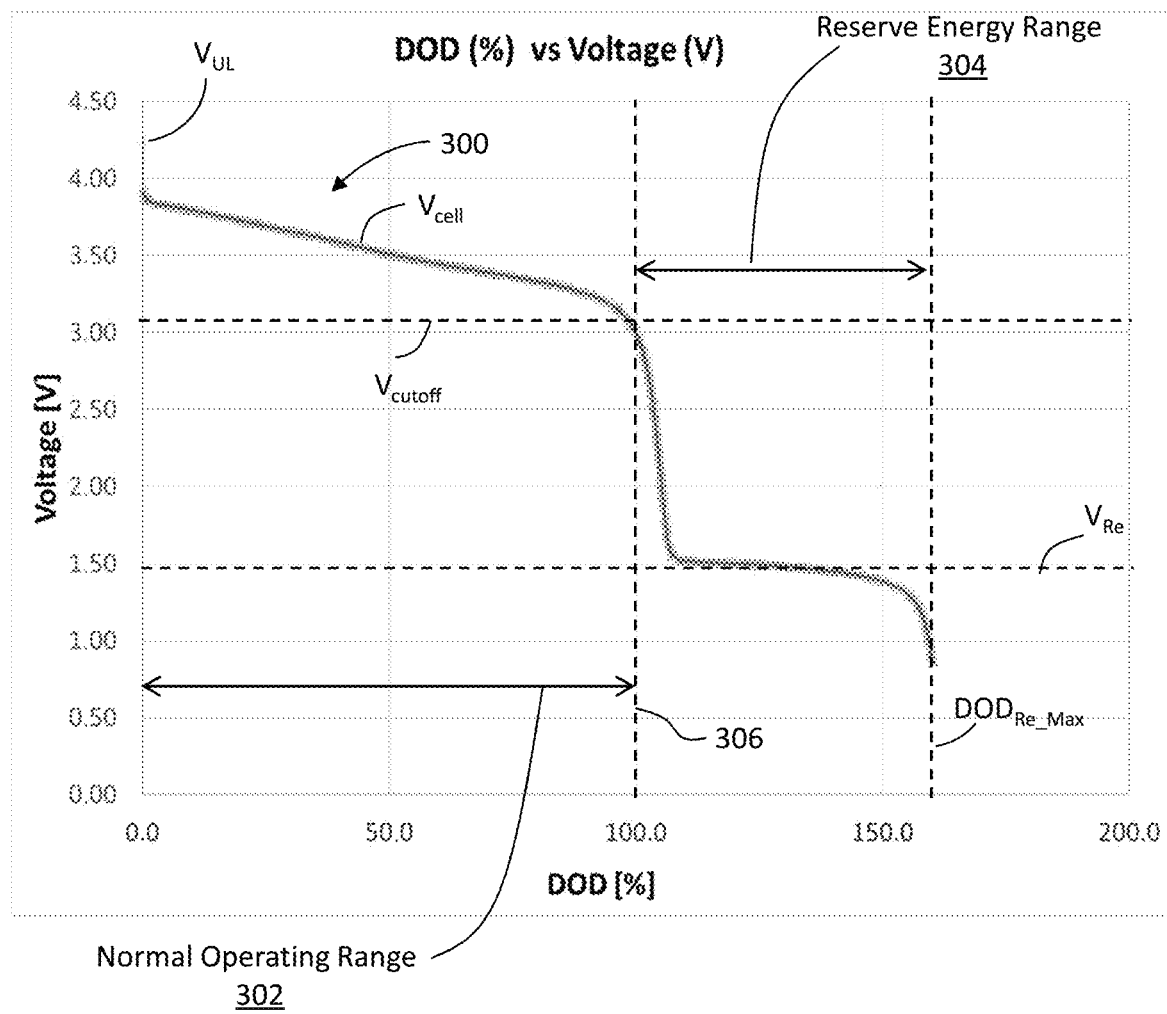
FIG. 3 is an example voltage discharge curve for the lithium metal battery of FIG. 1.

FIG. 3 shows an example voltage discharge curve 300 showing a plot of cell voltage, $V_{cell}$, versus depth of discharge (DOD) during cell discharge at an example discharge rate. DOD is defined as a percentage of the capacity of battery 102 between an upper voltage limit, $V_{UL}$, when the battery is fully charged, and a cutoff voltage $V_{cutoff}$ where battery controller 106 is configured to stop battery discharge to prevent damage to the cell. After $V_{cutoff}$, voltage curve 300 drops sharply as the intercalation sites of the cathode become saturated. When the cell reaches $V_{cutoff}$, the cell is considered fully discharged as indicated by DOD=100%, in the example, approximately 3 V. The cell voltage discharge curve 300 between $V_{UL}$ and $V_{cutoff}$ is considered the cell's normal operating range 302. During normal operation in normal operating range 302, the cell reversibly cycles between $V_{UL}$ and $V_{cutoff}$ where during charging, Li from cathode 204 is plated on anode 208 and during the discharge process shown in FIG. 3, the plated Li is stripped from the anode and intercalated back into the cathode. The discharge process is an electrochemical process that generates the electric potential plotted in FIG. 3 that is relatively constant throughout most of normal operating range 302 where the anode strip and cathode intercalation reactions are in electrochemical equilibrium. $V_{cell}$ begins to drop sharply after $V_{cell}$ drops below $V_{cut-off}$. In the illustrated example, the sharp drop off is due to the cathode intercalation sites becoming full or saturated, which effectively causes an increase in resistance that results in a sharp drop in voltage.

The example voltage discharge curve 300 shown in FIG. 3 is for a constant current discharge of 1.7 A. The slope and shape of voltage discharge versus energy level will vary with discharge rate, with a higher discharge rate resulting in a more rapid drop in cell voltage and a slower discharge rate resulting in a more gradual drop in cell voltage. Thus a continuous rapid discharge rate will result in the cell reaching $V_{cutoff}$ before 100% DOD, and a more gradual rate will result in a greater likelihood of extracting the battery's full normal operating range storage capacity (DOD of 100%) before the cell voltage reaches the cutoff voltage, $V_{cutoff}$. During normal operation of battery 102, battery controller 106 is configured to monitor cell voltage, current, and discharge rate and disconnect battery 102 or otherwise terminate discharge when the cell voltage reaches $V_{cutoff}$ to prevent damage to the battery and to maximize the lifetime of the battery. As noted above, in some examples, battery controller 106 may be configured to monitor the cell voltage of each of cells 108 and may discontinue discharge of battery 102 when the cell voltage, $V_{cell}$ of any one of the cells drops below the cutoff voltage $V_{cutoff}$. In other examples, battery controller 106 may be configured to selectively discontinue discharge of only ones of the cells 108 that drop below their corresponding cutoff voltage but allow the continued discharge of other cells 108 whose voltage is still above $V_{cutoff}$.

The characteristics of discharge curve 300 in normal operating range 302 are similar to the characteristics of a conventional lithium ion battery discharge curve. As with lithium metal battery 102, during discharge of a conventional lithium ion battery, lithium ions continuously fill cathode intercalation sites and the voltage curve drops precipitously when the cathode intercalation sites become saturated. In a lithium ion battery, however, when all cathode intercalation sites are substantially full, all anode intercalation sites are substantially empty, meaning there are no additional lithium ions available for continued energy extraction. Unlike a conventional lithium ion battery, lithium metal battery 102 is designed and configured to operate in a reserve energy operating range 304, where cells 108 are configured to continue to generate an electric potential after the cell voltage drops below the cutoff voltage, $V_{cutoff}$, and continues to discharge after all cathode intercalation sites are full and the cell voltage drops sharply. As shown in FIG. 3, after the cell voltage drops sharply, the voltage levels off at a non-zero reserve energy voltage, $V_{RE}$, after passing a transition point 306 between normal and reserve operating ranges 302, 304, whereas the cell voltage of a conventional lithium ion battery would simply continue to zero after reaching a DOD of 100%. After transition point 306, the electrochemical processes in the cell begin to transition from stripped lithium ions from the anode filling cathode intercalation sites to one or more reserve energy chemical reactions that also generate an electric potential.

Cells 108 may be designed and configured for a variety of different reserve energy chemical reactions and for varied amounts of reserve energy. Examples of reserve energy chemical reactions include oxidation-reduction reactions between stripped lithium ions and electrolyte 216. For example, in the case of a carbonate electrolyte 216, for example, one or more of ethylene carbonate (EC), propylene carbonate (PC), ethyl methyl carbonate (EMC), dimethyl carbonate (DMC), or diethyl carbonate (DEC), etc., an oxidation-reduction reaction in the form of RO—CO—OR+ Li+→LiOR+CO2+RH. Another example of a reserve energy reaction is continued chemical reactions between stripped lithium ions and cathode 204, resulting, in some examples, in a change of the phase composition of the cathode material, for example from layered $LiCoO_2$ to cubic spinel $Li_{1+y}Co_2O_4$. In some examples, cathodes 204 are designed and configured to maximize reserve energy by being formed from a material that more readily reacts with lithium ions in a reserve energy chemical reaction process. For example, cathode 204 may be formed from a material with a crystal structure that provides a chemical reaction at a lower activation energy level. For example, cathode 204 may be formed from a material with a layered structure, such as high temperature LCO, NCM532, NCM622, NCM811.

As shown in FIG. 3, discharge curve 300 drops sharply again at a maximum reserve energy DOD, $DOD_{RE\_max}$, where one or more of the reactants of the reserve energy reactions are consumed. Cells 108 may be designed and configured so the limiting reactant is the lithium metal on anodes 208. For example, in the reserve energy operating range 304, excess lithium metal can continue to be stripped from the anode after the intercalation sites of cathode 204 are saturated, providing additional reserve energy, until all or substantially all of the lithium metal has been stripped off of anode 208, leaving, for example, just current collector 208a. In one example, a volume of lithium metal located on anode 208 when the cell is in a discharged state is designed and configured for a target amount of reserve energy. For example, a thickness of lithium metal can be increased to increase reserve energy capacity. In one example, the relationship between lithium metal thickness and reserve energy is 1 um of lithium metal is approximately equal to 1% excess energy. For the example illustrated in FIG. 3, the cell has approximately 50% reserve energy discharge capacity that, in the illustrated example, corresponds to approximately an additional 20% reserve energy (due to a lower discharge voltage of 1.5V (energy=discharge capacity*voltage)), meaning an additional 50% of normal operating mode discharge capacity (and an additional 20% of normal operating mode energy), or a $DOD_{RE\_max}$ of approximately 150%, and the lithium metal on anode 208 in the normal fully discharged state (DOD of 100%) is approximately 20 μm. Thus, in the illustrated example, $DOD_{RE\_max}$ is 50% greater than DOD. In some examples, $DOD_{RE\_max}$ may be at least 20% greater than DOD, and in some examples, $DOD_{RE\_max}$ is 20% to 200% greater than DOD, and in some examples, $DOD_{RE\_max}$ is 20% to 150% greater than DOD, and in some examples, $DOD_{RE\_max}$ is 20% to 120% greater than DOD, and in some examples, $DOD_{RE\_max}$ is 20% to 100% greater than DOD, and in some examples, $DOD_{RE\_max}$ is 20% to 80% greater than DOD, and in some examples, $DOD_{RE\_max}$ is 20% to 60% greater than DOD, and in some examples, $DOD_{RE\_max}$ is 20% to 40% greater than DOD. The electrolyte 216 and cathode 204 may also be designed and configured in combination with the excess lithium metal volume for a specific amount of reserve energy. For example, a reduction potential of ethylene carbonate (EC) and dimethyl carbonate (DMC) is 0.9V and 1.32V vs. Li+/Li respectively. Changing carbonate type of an electrolyte (e.g., EC to DMC) will change reduction potential of the electrolyte and, as a result, will change reserve energy. Additionally, increasing electrolyte volume will increase the amount of reserve energy due to electrolyte reduction. Details of a phase composition change in a cathode material (e.g. layered $LiCoO_2$ to cubic spinel $Li_{1+y}Co_2O_4$) will also affect the amount of reserve energy available based on anode-to-cathode ratio (N/P ratio). In one example, the N/P ratio is 0.85-0.9 for cells in a discharged state of DOD=100%.

In some examples, battery 102 may be configured to normally not access reserve energy range 304 because the chemical reactions that occur within cells 108 to access the reserve energy may not be as reversible as the chemical reactions that occur during the normal operating range 302. In some examples, if all or a portion of reserve energy range 304 is accessed, the lifetime of battery 102 may be reduced, and in some examples, significantly reduced. For example, in some examples, if all or substantially all of reserve energy range 304 is consumed, battery 102 may no longer be rechargeable and may need to be replaced. Thus, during normal operation, battery controller 106 may be configured to monitor the operating conditions of battery 102 in realtime and discontinue discharge of the battery when cell voltage and/or battery voltage drops below the normal operation cutoff voltage, $V_{cutoff}$ or the battery SOC or DOD reaches 0% or 100%, respectively.

In some examples, load 104 may be configured to access the reserve energy in battery 102 by instructing battery controller 106 to extend operation into reserve energy operating range 304. Load 104 may be configured to instruct battery controller 106, via a reserve energy signal, SRE, to access reserve energy range 304 by, for example, replacing the normal operation cutoff voltage $V_{cutoff}$ with a lower cutoff voltage, ignoring the cutoff voltage, and/or replacing a target DOD of 100% with a DOD of greater than 100%. For example shown in FIG. 3, battery controller 106 may be configured to access reserve energy by disregarding cutoff voltage $V_{cutoff}$ and allowing the cell voltage to continue to drop until no energy remains, and/or may reduce $V_{cutoff}$ to a lower voltage, such as slightly less than $V_{RE}$, or an expected or calculated voltage associated with the completion of all reserve energy chemical reactions, e.g., approximately 1.3-1.4 volts in the illustrated example, or until a calculated DOD reaches an expected maximum DOD, e.g., approximately 150%-160% in the illustrated example. In some examples, one or both of memory 134 and memory 156 may store $DOD_{RE\_max}$ and/or $V_{RE}$ and battery controller 106 may access $DOD_{RE\_max}$ and/or $V_{RE}$ for estimating a remaining amount of reserve energy and/or for determining when to discontinue discharge of the battery.

In one example, guidance and navigation application 162 may include instructions for receiving realtime battery conditions, such as DOD from battery controller 106 and for continuously performing calculations for determining an amount of battery capacity required to return load 104 to a safe location. For example, when load 104 is an aerial vehicle, guidance and navigation application 162 may include instructions for determining a distance to a home base or other safe landing location and an amount of energy, ERH, to return to the home base. Guidance and navigation application 162 may be configured to generate user notifications or warnings, for example, audible, visual, and/or haptic warnings via a user interface, such as a user interface incorporated in remote controller 170, as the battery normal operation SOC begins to approach ERH. For example, application 162 may be configured to instruct the user to return the aerial vehicle to home base when $E_{SOC} \leq ERH+T$, where T is a threshold value, for example, between 5% and 25% of SOC. If load 104 is in an unsafe location (for example an aerial vehicle is still in the air) as the SOC of battery 102 approaches 0%, battery controller 106 may be configured to prompt a user to select a reserve energy operating mode, and in response to the user selection of the reserve energy operating mode, allow the battery to continue to discharge in the reserve energy operating range 304. In other examples, battery controller 106 and/or guidance and navigation application 162 may be configured to automatically allow the battery to extend into reserve energy operating range 304 if SOC approaches 0% and the vehicle is in an unsafe condition that might result in damage or loss of the vehicle if battery power was terminated.

After entering reserve energy operating range 304, battery controller 106 may continue to monitor realtime conditions of the battery and notify the user as the battery DOD begins to approach $DOD_{RE\_max}$. In some examples, guidance and navigation application 162 may be configured to transition to an autopilot mode and automatically begin to navigate the load to a safe location, such as GPS coordinates stored in memory 156, either after battery enters reserve energy range 304 or when $DOD_{REmax}-DOD \leq ERH+T$, where T is a threshold value, for example, between 5% and 25% of SOC.

Guidance and navigation application 162 may use any calculation technique known in the art as applicable to a given load 104 for calculating ERH. For example, in the case of an aerial vehicle, guidance and navigation application 162 may be configured to receive a distance from home base (or other safe location), a height above home base, an energy efficient velocity, and an estimate of wind velocity for the homeward trajectory based on the difference between actual velocity (m/s) and known predicted velocity based on, e.g., a manufacturer's specification, and may use one or more analytical techniques, such as application of the following four kinematic equations to determine ERH:

$$v = v_o + at \qquad \text{Eq. (1)}$$

$$\Delta x = \frac{v + v_o}{2} * t \qquad \text{Eq. (2)}$$

$$\Delta x = v_o t + \frac{1}{2}at^2 \qquad \text{Eq. (3)}$$

$$v^2 = v_o^2 + 2a\Delta x \qquad \text{Eq. (4)}$$

In one example, guidance and navigation application 162 may be configured to execute the following:

$$E_{RH} = E_{trans} - E_{pot'l} \qquad \text{Eq. (5)}$$

Wherein:

$$E_{trans} = 1/2 mv^2 + E_{ineff},$$

where v and m are the velocity and mass, of the vehicle, respectively, and Eineff is the energy expended through the inefficiencies of staying aloft; and Potential Energy, $E_{pot'l}$ due to height=mgh, where m is mass of the vehicle and g is the acceleration due to gravity.

Figure 4:
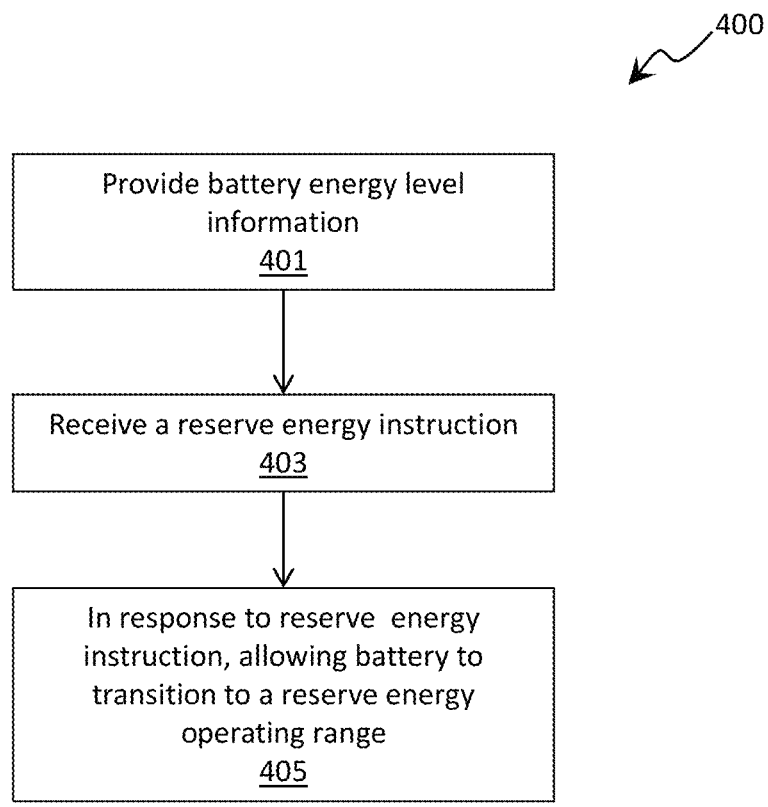
FIG. 4 is a flow chart of an example method of controlling a lithium metal battery to access reserve energy.

In one example, guidance and navigation application 162 may be configured to generate user notifications or warnings, for example, audible, visual, and/or haptic warnings via a user interface, such as a user interface incorporated in remote controller 170, as the battery normal operation SOC begins to approach ERH. For example, application 162 may be configured to instruct the user to return the aerial vehicle to home base when $E_{SOC} \leq ERH+T$, where T is a threshold value, for example, between 5% and 25% of SOC FIG. 4 illustrates one example method for controlling a lithium metal battery. Method 400 may be performed by a computing device, e.g., battery controller 106, that receives battery operating conditions, such as battery voltage, and is configured to determine a battery's realtime DOD or SOC, and/or compare a battery's voltage to a cutoff voltage. In block 401, the battery controller may provide battery information, such as battery or cell voltage, DOD, and/or SOC to a second computing device, such as the controller of a load being powered by the battery, such as load 104. In block 403, in response to sending the battery information, the load and/or an operator of the load, may send a reserve energy instruction to allow the battery to continue to discharge energy and transition from a normal operating range, such as normal operating range 302, to a reserve energy operating range, such as reserve energy operating range 304. In block 405, in response to receiving the reserve energy instruction, the battery controller may allow the battery to continue to discharge energy and transition to the reserve energy operating range.

Figure 5:
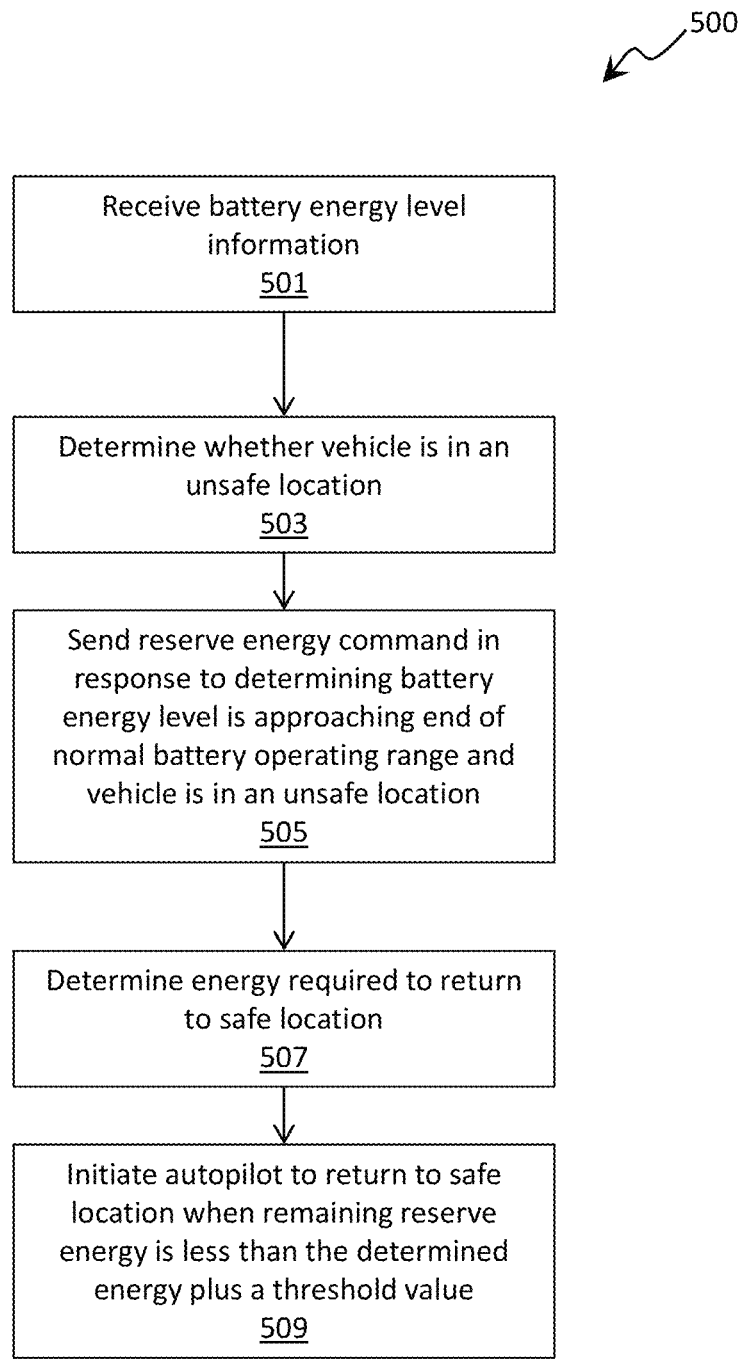
FIG. 5 is a flow chart of an example method of controlling a load that is powered by a lithium metal battery.

FIG. 5 illustrates one example method for controlling an electrically powered load that is powered by a lithium metal battery. Method 500 may be performed by a computing device, e.g., processor 160 of load 104. In block 501, the computing device may receive battery energy level information for a battery that is powering the load, for example, from a battery or battery controller, such as battery controller 106. At block 503, the computing device may determine if the load is in an unsafe location, for example, a location where if battery power suddenly ceased, the load could be damaged. As an example, if the load is an aerial vehicle, the computing device may check one or more signals received from sensors 154 to determine if the vehicle is currently in flight. At block 505, the computing device may send a reserve energy command to the battery in response to determining the battery energy level is approaching end of normal battery operating range and vehicle is in an unsafe location so that the battery will continue to provide power to the load by continuing to discharge power even if the battery reaches an end of a normal operating range and a SOC of 0%. As noted above, in some examples, when the battery discharges reserve energy and drops below 0% SOC, the battery may be damaged, for example, reserve energy chemical reactions may occur that may not be reversible, which may result in a reduction in the lifespan of the battery or the inability to recharge the battery. The computing device, however, may be configured to send a reserve energy command to the battery to avoid damage to the load even if it results in damage to the battery.

At block 507, the computing device may perform a transport to safe location energy calculation to determine an amount of battery energy or power required to return the load to a safe location. In some examples, the computing device may continuously perform the calculation based on realtime data from sensors, e.g., sensors 154, to provide a realtime transport to safe location energy value. In some examples, the computing device may continuously perform the transport to safe location energy calculation after the battery SOC reaches a minimum value, such as a value in the range of 10%-25%. In some examples, the computing device may continuously perform the transport to safe location energy calculation after sending a reserve energy command signal because the battery is transitioning into reserve energy and limited battery power remains. In block 509, the computing device may initiate an autopilot operation to automatically return the vehicle to a safe location after determining a remaining amount of reserve energy is less than the determined energy to transport to a safe location plus a threshold value, where the threshold value may be, for example, in the range of 0% to 25%, and in some examples, may be a user-defined value.

Any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
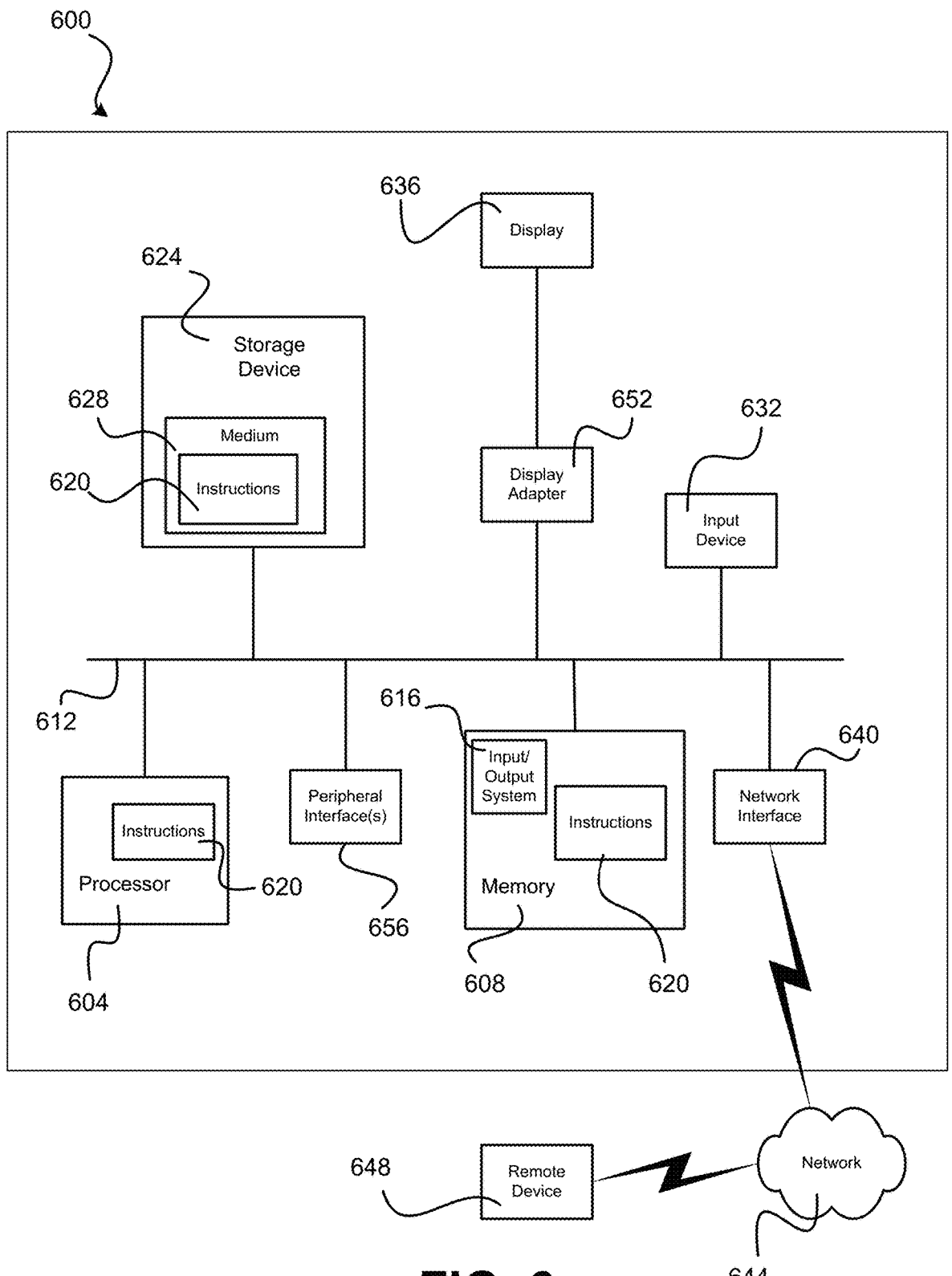
FIG. 6 is a schematic diagram of an example computing system that may be used to implement aspects of the present disclosure.

FIG. 6 shows a diagrammatic representation of one embodiment of a computing device in the exemplary form of a computer system 600 within which a set of instructions for causing a control system, such as the battery control system and/or load control systems of FIG. 1, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Memory 608 may include various components (e.g., machine-readable media) including, but not limited to, a random access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

Computer system 600 may also include a storage device 624. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereof.

In some examples, aspects of the present disclosure may also include a device of the present disclosure configured to receive electrical energy from a lithium metal battery. The device includes a processor configured to be operably coupled to the lithium metal battery and configured to receive a battery signal, the battery signal including operating condition information for the lithium metal battery; determine, based on the battery signal, whether a reserve energy capacity of the battery is required; and send a reserve energy signal to the battery in response to determining the reserve energy capacity is required; wherein the reserve energy signal includes an instruction to allow a voltage of the battery to drop below a normal operating range cutoff voltage. Such exemplary device may also include one or more of the following features: the battery signal includes information relating to a remaining amount of normal operating range energy stored in the battery; the step of determining includes determining a likelihood the load would be damaged if power from the battery were to immediately cease; the step of sending a reserve energy signal includes instructing the battery to continue to discharge energy after reaching a normal operating range state of charge of 0%; substantially all intercalation sites of one or more cathodes of the battery are substantially saturated when the battery reaches the normal operating range state of charge of 0%; the step of sending a reserve energy signal includes instructing the battery to allow a voltage of the battery to drop to a reserve energy voltage and plateau at the reserve energy voltage until substantially all of the reserve energy capacity is discharged, the reserve energy voltage being less than the normal operating range cutoff voltage; the step of sending a reserve energy signal includes instructing the battery to operate in a reserve energy operating range where substantially all intercalation sites of one or more cathodes of the battery are substantially saturated; the reserve energy operating range is an operating range where substantially all intercalation sites of one or more cathodes of the battery are substantially saturated; the reserve energy operating range is an operating range where electric potential is generated by reserve energy chemical reactions that include at least one of oxidation-reduction reactions between stripped lithium ions and an electrolyte of the battery and chemical reactions between stripped lithium ions and a cathode of the battery resulting in a phase change of the cathode; the battery signal is an indication of a normal operating range energy level of the battery, the processor further configured to receiving a reserve energy capacity value indicating a maximum amount of reserve energy; wherein the step of determining whether a reserve energy capacity of the battery is required includes determining an amount of energy required to transport the load to a safe location; and automatically initiating an autopilot operation to autonomously transport the load to the safe location when the normal operating range energy level plus the reserve energy capacity is less than the determined amount of energy required to transport the load to the safe location plus a threshold value.

In some further examples, a machine-readable storage medium of the present disclosure may include machine-readable instructions for performing a method of controlling a lithium metal battery having a lithium metal anode and a cathode with intercalation sites, the lithium metal battery having a normal operating range between 100% state of charge (SOC) and 0% SOC, the 0% SOC corresponding to a discharge condition where substantially all of the cathode intercalation sites are saturated with lithium ions, the machine-readable instructions comprising instructions for monitoring an operating condition of the lithium metal battery as the battery discharges energy; receiving a reserve energy signal; and allowing the battery to enter a reserve energy operating range and discharge reserve energy by allowing the battery to discharge energy below a SOC of 0% in response to the reserve energy signal. Such an exemplary machine-readable storage medium may also include one or more of the following features: the lithium metal battery has a normal operation cutoff voltage, wherein the step of allowing includes allowing a voltage generated by the battery to drop below the normal operation cutoff voltage; a depth of discharge (DOD) of the lithium metal battery is 100% at the SOC of 0%, the method further comprising providing, to a load connected to the battery, a maximum DOD, DODRE_max, associated with discharging both the battery normal operating range energy and the reserve energy, wherein DODRE_max>DOD; DODRE_max is at least 20% greater than DOD; the instructions for the step of allowing the battery to enter a reserve energy operating range includes allowing reserve energy chemical reactions to occur in the battery to generate electrical energy after the SOC reaches 0%; the cathode is formed from a cathode material, further wherein the reserve energy chemical reactions include at least one of oxidation-reduction reactions between stripped lithium ions and an electrolyte of the battery and chemical reactions between stripped lithium ions and the cathode material resulting in a phase change of the cathode material; the instructions further comprise calculating a reserve energy capacity value, wherein the calculation is a function of an operating history of the battery.

In some further examples, a machine-readable storage medium of the present disclosure may include machine-readable instructions for performing a method of operating a load, the machine-readable instructions comprising instructions for receiving a battery signal, the battery signal including operating condition information for a lithium metal battery providing electrical energy to the load; determining, based on the battery signal, whether a reserve energy capacity of the battery is required; and sending a reserve energy signal to the battery in response to determining the reserve energy capacity is required. Such an exemplary machine-readable storage medium may also include one or more of the following features: the battery signal includes information relating to a remaining amount of normal operating range energy stored in the battery; the instructions for the step of determining includes instructions for determining a likelihood the load would be damaged if power from the battery were to immediately cease; the instructions for the step of sending a reserve energy signal includes instructions for instructing the battery to continue to discharge energy after reaching a normal operating range state of charge of 0%; substantially all intercalation sites of one or more cathodes of the battery are substantially saturated when the battery reaches the normal operating range state of charge of 0%; the instructions for the step of sending a reserve energy signal includes instructions for instructing the battery to allow a voltage of the battery to drop below a normal operating range cutoff voltage; the instructions for the step of sending a reserve energy signal includes instructions for instructing the battery to operate in a reserve energy operating range; the reserve energy operating range is an operating range where substantially all intercalation sites of one or more cathodes of the battery are substantially saturated; the reserve energy operating range is an operating range where electric potential is generated by reserve energy chemical reactions that include at least one of oxidation-reduction reactions between stripped lithium ions and an electrolyte of the battery and chemical reactions between stripped lithium ions and a cathode of the battery resulting in a phase change of the cathode; the battery signal is an indication of a normal operating range energy level of the battery, the method instructions further comprising instructions for receiving a reserve energy capacity value indicating a maximum amount of reserve energy; wherein the step of determining whether a reserve energy capacity of the battery is required includes determining an amount of energy required to transport the load to a safe location; and automatically initiating an autopilot operation to autonomously transport the load to the safe location when the normal operating range energy level plus the reserve energy capacity is less than the determined amount of energy required to transport the load to the safe location plus a threshold value.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

What is claimed is:

1. A method of controlling a lithium metal battery having a lithium metal anode and a cathode with intercalation sites, the lithium metal battery having a normal operating range between 100% state of charge (SOC) and 0% SOC, the 0% SOC corresponding to a discharge condition where substantially all of the cathode intercalation sites are substantially saturated with lithium ions, the method comprising:
   monitoring an operating condition of the lithium metal battery as the battery discharges energy;
   receiving a reserve energy signal; and
   allowing the battery to enter a reserve energy operating range and discharge reserve energy by allowing the battery to discharge energy below a SOC of 0% in response to the reserve energy signal.

2. The method of claim 1, wherein the lithium metal battery has a normal operation cutoff voltage, wherein the step of allowing includes allowing a voltage generated by the battery to drop below the normal operation cutoff voltage.

3. The method of claim 1, wherein a depth of discharge (DOD) of the lithium metal battery is 100% at the SOC of 0%, the method further comprising providing, to a load connected to the battery, a maximum DOD, $DOD_{RE\_max}$, associated with discharging both the battery normal operating range energy and the reserve energy, wherein $DOD_{RE\_max}>DOD$.

4. The method of claim 3, wherein $DOD_{RE\_max}$ is at least 20% greater than DOD.

5. The method of claim 1, wherein the step of allowing the battery to enter a reserve energy operating range includes allowing reserve energy chemical reactions to occur in the battery to generate electrical energy after the SOC reaches 0%.

6. The method of claim 5, wherein the cathode is formed from a cathode material, further wherein the reserve energy chemical reactions include at least one of oxidation-reduction reactions between stripped lithium ions and an electrolyte of the battery and chemical reactions between stripped lithium ions and the cathode material resulting in a phase change of the cathode material.

7. The method of claim 1, further comprising calculating a reserve energy capacity value, wherein the calculation is a function of an operating history of the battery.

8. The method of claim 1, wherein an electric potential in the reserve energy operating range is generated by reserve energy chemical reactions that are at least partially irreversible.

9. A method of operating a load, the method comprising:
receiving a battery signal, the battery signal including operating condition information for a lithium metal battery providing electrical energy to the load;
determining, based on the battery signal, whether a reserve energy capacity of the battery is required; and
sending a reserve energy signal to the battery in response to determining the reserve energy capacity is required;
wherein the reserve energy signal includes an instruction to allow a voltage of the battery to drop below a normal operating range cutoff voltage resulting in reserve energy chemical reactions that are at least partially irreversible.

10. The method of claim 9, wherein the battery signal includes information relating to a remaining amount of normal operating range energy stored in the battery.

11. The method of claim 9, wherein the step of determining includes determining a likelihood the load would be damaged if power from the battery were to immediately cease.

12. The method of claim 9, wherein the step of sending a reserve energy signal includes instructing the battery to continue to discharge energy after reaching a normal operating range state of charge of 0%.

13. The method of claim 12, wherein substantially all intercalation sites of one or more cathodes of the battery are substantially saturated when the battery reaches the normal operating range state of charge of 0%.

14. The method of claim 9, wherein the step of sending a reserve energy signal includes instructing the battery to allow a voltage of the battery to drop to a reserve energy voltage and plateau at the reserve energy voltage until substantially all of the reserve energy capacity is discharged, the reserve energy voltage being less than the normal operating range cutoff voltage.

15. The method of claim 9, wherein the step of sending a reserve energy signal includes instructing the battery to operate in a reserve energy operating range.

16. The method of claim 15, wherein the reserve energy operating range is an operating range where substantially all intercalation sites of one or more cathodes of the battery are substantially saturated.

17. The method of claim 16, wherein the reserve energy operating range is an operating range where an electric potential is generated by reserve energy chemical reactions that include at least one of oxidation-reduction reactions between stripped lithium ions and an electrolyte of the battery and chemical reactions between stripped lithium ions and a cathode of the battery resulting in a phase change of the cathode.

18. The method of claim 9, wherein the battery signal is an indication of a normal operating range energy level of the battery, the method further comprising:
receiving a reserve energy capacity value indicating a maximum amount of reserve energy;
wherein the step of determining whether a reserve energy capacity of the battery is required includes determining an amount of energy required to transport the load to a safe location; and
automatically initiating an autopilot operation to autonomously transport the load to the safe location when the normal operating range energy level plus the reserve energy capacity is less than the determined amount of energy required to transport the load to the safe location plus a threshold value.

19. The method of claim 9, wherein the reserve energy chemical reactions result in one or more of damage to the battery, reduction in a lifespan of the battery, or a reduction in a recharge capacity of the battery.

20. A battery controller for controlling a lithium metal battery having a lithium metal anode and a cathode with intercalation sites, the lithium metal battery having a normal operating range between 100% state of charge (SOC) and 0% SOC, the 0% SOC corresponding to a discharge condition where substantially all of the cathode intercalation sites are substantially saturated with lithium ions, the battery controller comprising:
a processor configured to be operably coupled to the lithium metal battery and configured to:
monitor an operating condition of the lithium metal battery as the battery discharges energy;
receive a reserve energy signal; and
allow the battery to enter a reserve energy operating range and discharge reserve energy by allowing the battery to discharge energy below a SOC of 0% in response to the reserve energy signal.

21. The battery controller of claim 20, wherein the lithium metal battery has a normal operation cutoff voltage, wherein the step of allowing includes allowing a voltage generated by the battery to drop below the normal operation cutoff voltage.

22. The battery controller of claim 20, wherein a depth of discharge (DOD) of the lithium metal battery is 100% at the SOC of 0%, the processor further configured to provide, to a load connected to the battery, a maximum DOD, $DOD_{RE\_max}$, associated with discharging both the battery normal operating range energy and the reserve energy, wherein $DOD_{RE\_max}$>DOD.

23. The battery controller of claim 22, wherein $DOD_{RE\_max}$ is at least 20% greater than DOD.

24. The battery controller of claim 20, wherein the step of allowing the battery to enter a reserve energy operating range includes allowing reserve energy chemical reactions to occur in the battery to generate electrical energy after the SOC reaches 0%.

25. The battery controller of claim 24, wherein the cathode is formed from a cathode material, further wherein the reserve energy chemical reactions include at least one of oxidation-reduction reactions between stripped lithium ions and an electrolyte of the battery and chemical reactions between stripped lithium ions and the cathode material resulting in a phase change of the cathode material.

26. The battery controller of claim 20, wherein the processor is further configured to calculate a reserve energy capacity value, wherein the calculation is a function of an operating history of the battery.

27. A method of controlling a lithium metal battery having a lithium metal anode and a cathode, the lithium metal battery having a normal operating range between 100% state of charge (SOC) and 0% SOC, the method comprising:
- monitoring an operating condition of the lithium metal battery as the battery discharges energy;
- receiving a reserve energy signal; and
- allowing the battery to enter a reserve energy operating range and discharge reserve energy by allowing the battery to discharge energy below a SOC of 0% in response to the reserve energy signal;
- wherein an electric potential in the reserve energy operating range is generated by reserve energy chemical reactions that are at least partially irreversible.

28. The method of claim 27, further comprising:
- receiving a battery signal, the battery signal indicating a normal operating range energy level of the battery, wherein the battery is providing electrical energy to a load;
- determining an amount of energy required to transport the load to a location;
- determining, based on the battery signal and the determined amount of energy, whether a reserve energy capacity of the battery is required to transport the load to the location; and
- initiating an autopilot operation to transport the load to the location when the normal operating range energy level plus the reserve energy capacity is less than the determined amount of energy required to transport the load to the location plus a threshold value.

* * * * *